United States Patent
Castaneda et al.

(10) Patent No.: US 7,088,214 B2
(45) Date of Patent: Aug. 8, 2006

(54) ON-CHIP MULTIPLE TAP TRANSFORMER AND INDUCTOR (75) Inventors: Jesus A. Castaneda, Marina Del Ray, CA (US); Razieh Rogougaran, Marina Del Ray, CA (US); Iqbal S. Bhatti, Los Angeles, CA (US); Hung Yu Yang, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/727,422

(22) Filed: Dec. 4, 2003

(65) Prior Publication Data
US 2004/0108927 A1    Jun. 10, 2004

(51) Int. Cl.
    *H01F 5/00* (2006.01)
(52) U.S. Cl. ..................................... 336/200
(58) Field of Classification Search ................. 336/65, 336/83, 192, 200, 232
    See application file for complete search history.

(56) References Cited

U.S. PATENT DOCUMENTS

| | | | | |
|---|---|---|---|---|
| 4,816,784 A | * | 3/1989 | Rabjohn | ................... 333/24 R |
| 6,476,704 B1 | * | 11/2002 | Goff | ............................ 336/200 |
| 6,577,219 B1 | * | 6/2003 | Visser | ......................... 336/200 |
| 6,580,334 B1 | * | 6/2003 | Simburger et al. | ......... 333/24 R |
| 6,608,364 B1 | * | 8/2003 | Carpentier | ................... 257/531 |
| 6,661,325 B1 | * | 12/2003 | Suh et al. | .................... 336/200 |
| 6,707,367 B1 | * | 3/2004 | Castaneda et al. | ........... 336/200 |

* cited by examiner

Primary Examiner—Tuyen T Nguyen
(74) Attorney, Agent, or Firm—Garlick Harrison & Markison; Bruce E. Stuckman (57) ABSTRACT An on-chip multiple tap transformer balun includes a $1^{st}$ winding and a $2^{nd}$ winding having two portions. The $1^{st}$ winding is on a $1^{st}$ layer of an integrated circuit and is operably coupled for a single ended signal. The $1^{st}$ and $2^{nd}$ portions of the $2^{nd}$ winding are on a $2^{nd}$ layer of the integrated circuit. The $1^{st}$ portion of the $2^{nd}$ winding includes a $1^{st}$ node, a $2^{nd}$ node, and a tap. The $1^{st}$ node is operably coupled to receive a $1^{st}$ leg of a $1^{st}$ differential signal and the $2^{nd}$ node is coupled to a reference potential. The tap of the $1^{st}$ portion is operably coupled for a $1^{st}$ leg of a $2^{nd}$ differential signal. The $2^{nd}$ portion of the $2^{nd}$ winding includes a $1^{st}$ node, $2^{nd}$ node, and tap. The $1^{st}$ node is operably coupled to receive a $2^{nd}$ leg of the $1^{st}$ differential signal and the $2^{nd}$ node is operably coupled to the reference potential. The tap of the $2^{nd}$ portion is coupled for a $2^{nd}$ leg of the $2^{nd}$ differential signal. The $1^{st}$ and $2^{nd}$ portions of the $2^{nd}$ winding are symmetrical with respect to the $1^{st}$ and $2^{nd}$ nodes and with respect to the tap nodes.

19 Claims, 6 Drawing Sheets top view

FIG. 2
transformer 30

FIG. 1
transformer 10

FIG. 5 bottom view

FIG. 4 cross-sectional side view

FIG. 3 top view

FIG. 7 cross-sectional side view

FIG. 6 cross-sectional side view

FIG. 8
top view

FIG. 9
top view

2nd winding 80

FIG. 10
transformer 100

ON-CHIP MULTIPLE TAP TRANSFORMER AND INDUCTOR

This patent application is claiming priority under 35 USC § 120 to co-pending patent application entitled ON-CHIP MULTIPLE TAP TRANSFORMER AND INDUCTOR having a Ser. No. 10/200,990 and a filing date of Jul. 23, 2002.

BACKGROUND OF THE INVENTION

1. Technical Field of the Invention

This invention relates generally to radio communication technology and more particularly to transformers used within the radio communication technology.

2. Description of Related Art

Two-way radios, which may be incorporated in wireless communication devices, are known to include an antenna, a transformer, an antenna switch, a receiver section, and a transmitter section. The antenna switch couples either the receiver section or the transmitter section to the antenna via the transformer. The transformer may be a transformer balun (balanced/unbalanced) and is generally used to convert single ended signals into differential signals and conversely to convert differential signals into single ended signals. For example, received RF signals via the antenna are converted into differential signals, which are provided to a low noise amplifier of the receiver section. Conversely, differential signals from a power amplifier of the transmitter section are converted into single ended signals, which are provided to the antenna.

As the demand for integrated circuit radios increases, many attempts have been made to integrate transformers and/or transformer baluns onto radio frequency integrated circuits. However, such integration has been limited due to flux leakage, capacitive coupling limits, and significant series resistance. To reduce these limitations, advances have been made in transformer IC design including coplanar interleaved transformers, toroidal and concentric transformers, overlay transformers and symmetric coplanar transformers. Coplanar interleaved transformers have the primary and secondary windings interleaved on the same integrated circuit layer, where the primary and secondary windings are constructed of planer metal traces. While coplanar interleaved transformers reduces size and resistance and are widely used, they suffer from low quality (Q) factor, small coupling coefficients, and, if used as a balun, the center tap is often at an undesirable location, resulting in an asymmetric geometry. As is known, asymmetry of a transformer winding causes an imbalance in the resulting differential signal and/or an imbalance in the resulting single ended signal from a differential signal.

Toroidal and concentric transformers have the primary and secondary windings on several dielectric layers of an integrated circuit. Each layer includes one or more primary and secondary turns, where turns on different layers are coupled in series using vias. Each of the primary turns, on each layer, is constructed around the secondary turns on the same layer. While such toroidal and concentric transformers are well suited for multi-layer structures, they suffer from weak coupling, inconvenient center tap locations, and are asymmetrical.

Overlay transformers include a primary spiral inductor on a top layer and a secondary spiral inductor on a lower layer. Such transformers have high coupling coefficients and relatively small area; however, the secondary is asymmetrical creating a loading asymmetry.

Symmetric coplanar transformers include the primary and secondary windings on the same layer with interconnecting bridges on lower layers. While such transformers have high symmetry, they have weak magnetic coupling and are usually large for desirable inductor values.

While each of these various embodiments of on-chip transformers have utility and certain applications they do not provide multiple uses for various applications. Therefore, a need exists for a multi-use on-chip transformer that is small, provides reasonable inductance values, has a high quality factor, reduces resistance and has a high coupling coefficient.

BRIEF SUMMARY OF THE INVENTION

The on-chip multiple tap transformer and inductor of the present invention substantially meets these needs and others. One embodiment of an on-chip multiple tap transformer balun in accordance with the present invention includes a $1^{st}$ winding and a $2^{nd}$ winding having two portions. The $1^{st}$ winding is on a $1^{st}$ layer of an integrated circuit and is operably coupled for a single ended signal. The $1^{st}$ and $2^{nd}$ portions of the $2^{nd}$ winding are on a $2^{nd}$ layer of the integrated circuit. The $1^{st}$ portion of the $2^{nd}$ winding includes a $1^{st}$ node, a $2^{nd}$ node, and a tap. The $1^{st}$ node is operably coupled to receive a $1^{st}$ leg of a $1^{st}$ differential signal and the $2^{nd}$ node is coupled to a reference potential. The tap of the $1^{st}$ portion is operably coupled for a $1^{st}$ leg of a $2^{nd}$ differential signal. The $2^{nd}$ portion of the $2^{nd}$ winding includes a $1^{st}$ node, $2^{nd}$ node, and tap. The $1^{st}$ node is operably coupled to receive a $2^{nd}$ leg of the $1^{st}$ differential signal and the $2^{nd}$ node is operably coupled to the reference potential. The tap of the $2^{nd}$ portion is coupled for a $2^{nd}$ leg of the $2^{nd}$ differential signal. The $1^{st}$ and $2^{nd}$ portions of the $2^{nd}$ winding are symmetrical with respect to the $1^{st}$ and $2^{nd}$ nodes and with respect to the tap nodes. Such an on-chip multiple tap transformer balun may be used to convert single ended signals into one or more differential signals. Further, the on-chip multiple tap transformer balun may be used to convert one or more differential signals into a single ended signal.

Another embodiment of a multi-tap differential inductor in accordance with the present invention includes a $1^{st}$ winding and a $2^{nd}$ winding. The $1^{st}$ winding is on a $1^{st}$ layer of an integrated circuit and is coupled for a single ended signal. The $2^{nd}$ winding is on a $2^{nd}$ layer of the integrated circuit and is coupled to receive $1^{st}$ and $2^{nd}$ differential signals. To receive such differential signals, the $2^{nd}$ winding includes $1^{st}$ and $2^{nd}$ nodes that are coupled to receive the $1^{st}$ differential signal and $1^{st}$ and $2^{nd}$ taps to receive the $2^{nd}$ differential signal. A $3^{rd}$ tap of the secondary is coupled to a reference potential. The $2^{nd}$ winding is symmetrical about the $3^{rd}$ tap to produce a symmetrical on-chip multi-tap transformer balun.

An embodiment of an on-chip multi-tap differential inductor includes a $1^{st}$ winding and a $2^{nd}$ winding. Each winding is on the same layer of an integrated circuit. The $1^{st}$ winding includes a $1^{st}$ node that is coupled to receive a $1^{st}$ leg of a differential signal and a $2^{nd}$ node coupled to a reference potential. The $1^{st}$ winding also includes a tap that is operably coupled to receive a $1^{st}$ leg of a $2^{nd}$ differential signal. The $2^{nd}$ winding includes a $1^{st}$ node coupled to receive a $2^{nd}$ leg of the $1^{st}$ differential signal and a $2^{nd}$ node coupled to the reference potential. The $2^{nd}$ winding further includes a tap operably coupled for a $2^{nd}$ leg of the $2^{nd}$ differential signal. The $2^{nd}$ winding is substantially symmetrical to the $1^{st}$ winding and the tap of the $1^{st}$ winding is substantially symmetrical to the tap of the $2^{nd}$ winding.

The various embodiments of multiple tap differential transformer baluns and differential inductors provide for multiple uses in various applications including radio frequency integrated circuits. By including one or more sets of taps, an on-chip multi-tap transformer balun or inductor, the transformer or inductor may be used in a variety of different manners, which may correspond to different operating frequencies, different desired inductancies, different transformer ratios, et cetera.

DETAILED DESCRIPTION OF THE INVENTION

Figure 1:
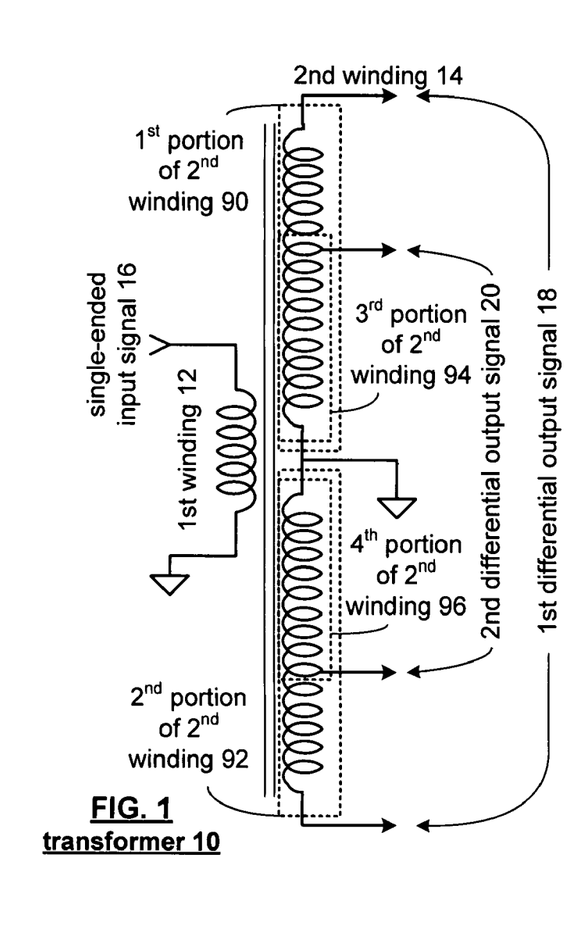
FIG. 1 is a schematic diagram of a multi-tap transformer balun in accordance with the present invention.

FIG. 1 is a schematic diagram of an on-chip multi-tap transformer balun 10 that is operably coupled to convert a single ended input signal 16 into a $1^{st}$ differential output signal 18 and a $2^{nd}$ differential output signal 20. The transformer 10 includes a $1^{st}$ winding 12 and a $2^{nd}$ winding 14. The $2^{nd}$ winding includes a $1^{st}$ portion 90 and a $2^{nd}$ portion 92 each of which includes two nodes and a tap. The common nodes of the $1^{st}$ portion 90 and $2^{nd}$ portion 92 of the $2^{nd}$ winding 14 are operably coupled to a reference potential (e.g., AC ground). The taps of the $1^{st}$ portion 90 and $2^{nd}$ portion 92 of the $2^{nd}$ winding 14 are operably coupled to produce the $2^{nd}$ differential output signal 20 across the $3^{rd}$ portion 94 and $4^{th}$ portion 96 of the $2^{nd}$ winding 14. The $1^{st}$ nodes of the $1^{st}$ and $2^{nd}$ portions, 90 and 92, of the $2^{nd}$ winding 14 are operably coupled to produce the $1^{st}$ differential output signal 18.

The taps are symmetrical with respect to the node coupled to the AC ground reference potential. The $1^{st}$ and $2^{nd}$ portions, 90 and 92, of the $2^{nd}$ winding 14 are symmetrical to each other such that balance differential output signals 18 and 20 are produced. The turns ratio between the $1^{st}$ winding 12 and the $2^{nd}$ winding 14 depends on the desired gain to be achieved via the transformer. For example, the primary winding may consist of two turns while the $2^{nd}$ winding consists of nine turns. As one of average skill in the art will appreciate, other combinations of turn ratios may be used to provide a desired gain. As one of average skill in the art will further appreciate, in many applications, only one set of the differential outputs will be used at a given time.

Figure 2:
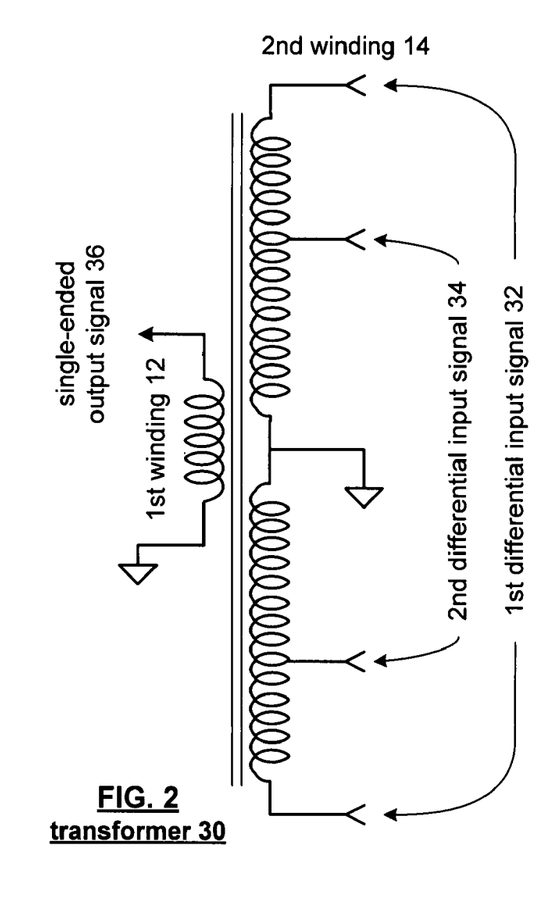
FIG. 2 is a schematic diagram of an alternate multiple tap transformer balun in accordance with the present invention.

FIG. 2 illustrates an on-chip multi-tap transformer balun 30 that is operably coupled to convert one or more differential input signals 32 or 34 into a single ended output signal 36. In this embodiment, the transformer 30 again includes the $1^{st}$ winding 12 and $2^{nd}$ winding 14. In this embodiment, the $1^{st}$ differential input signal 32 or the $2^{nd}$ differential input signal 34 will be coupled to the secondary winding 14. As such, the $1^{st}$ winding 12 produces a single ended output signal 36 corresponding to either the $1^{st}$ differential input signal 32 or the $2^{nd}$ differential input signal 34.

The $2^{nd}$ winding 14 includes a $1^{st}$ and $2^{nd}$ portion each having a $1^{st}$ node, a $2^{nd}$ node, and a tap. The $2^{nd}$ nodes of the respective portions of the $2^{nd}$ winding 14 are operably coupled to the AC ground reference potential and the $1^{st}$ nodes of the respective portions are coupled to receive the $1^{st}$ differential input signal 32. The taps of each portion of the $2^{nd}$ winding 14 are operably coupled to receive the $2^{nd}$ differential input signal 34.

As one of average skill in the art will appreciate, the $1^{st}$ and $2^{nd}$ differential input signals 34 may be used individually or simultaneously to provide inputs to the transformer 30 as long as, for simultaneous use, the inputting of two signals does not saturate the transformer. The resulting single ended output signal 38 will represent a mixing of the $1^{st}$ and $2^{nd}$ differential input signals 32 and 34.

Figure 3:
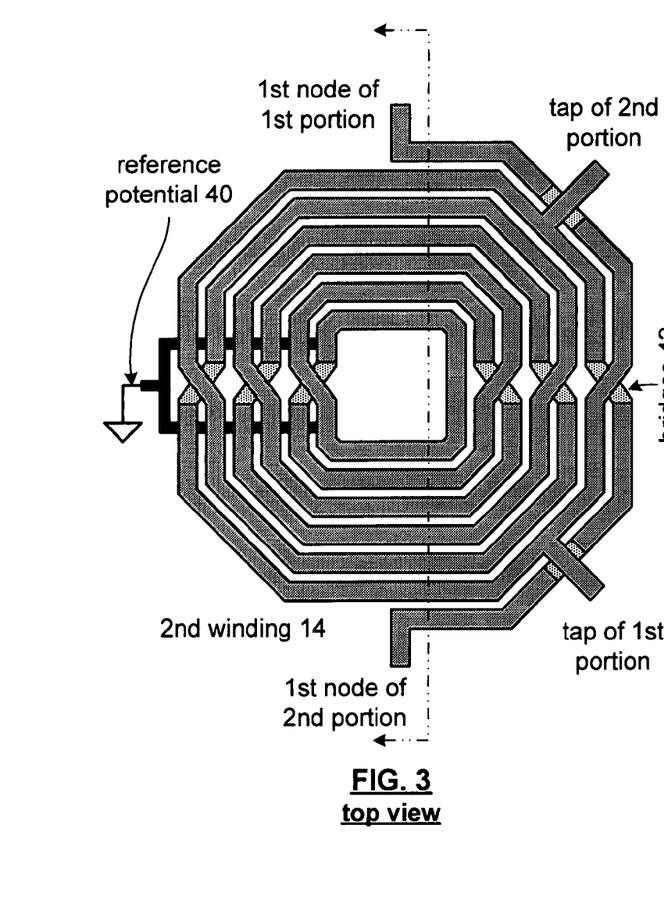
FIG. 3 illustrates a top view of a multi-tap winding of a multi-tap transformer balun or inductor in accordance with the present invention.
Figure 4:
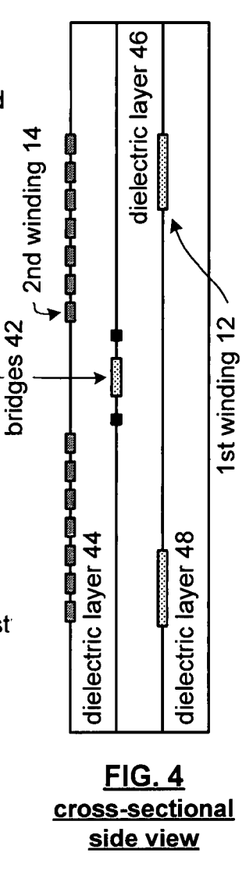
FIG. 4 is a cross sectional view of a multi-tap transformer balun or inductor in accordance with the present invention.
Figure 5:
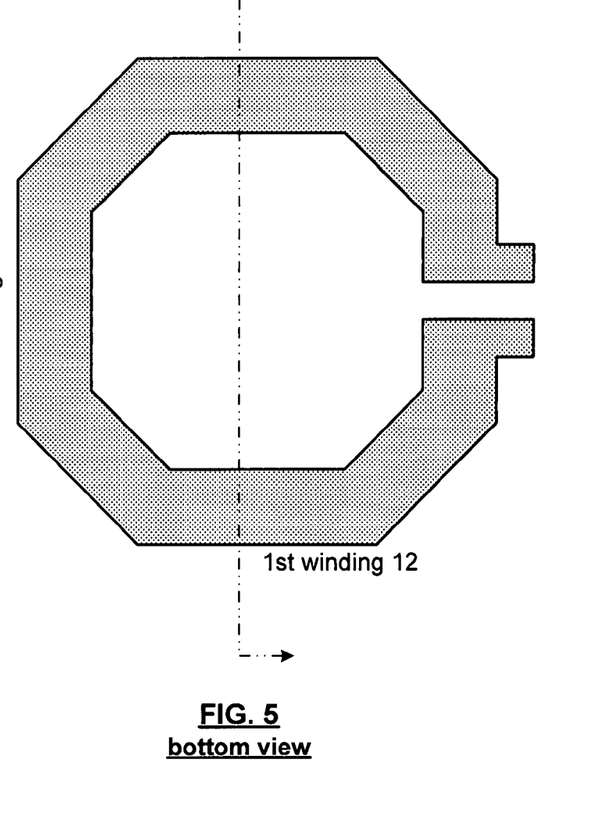
FIG. 5 is a bottom view of a $1^{st}$ winding of an on-chip multi-tap transformer balun in accordance with the present invention.

FIGS. 3–5 illustrate a physical embodiment of the transformers 10 or 30 of FIGS. 1 and 2. FIG. 3 illustrates the top view of the $2^{nd}$ winding 14. As shown, the $2^{nd}$ winding 14 includes a $1^{st}$ node of a $2^{nd}$ portion, a tap of the $1^{st}$ portion, bridges 42, a tap of the $2^{nd}$ portion, a $1^{st}$ node of the $1^{st}$ portion, and coupling to a reference potential 40. The number of turns for the $2^{nd}$ winding 14 may vary from one to multiple turns. The $2^{nd}$ winding 14 may be fabricated utilizing the metalization layer of the integrated circuit having the lowest resistivity. Typically, for a CMOS process, this particular metalization layer is the top metal layer.

FIG. 3 further illustrates a physical embodiment for a multi-tap differential inductor. For this inductor, the $1^{st}$ winding corresponds to the $1^{st}$ portion of the $2^{nd}$ winding 14 and the $2^{nd}$ winding corresponds to the $2^{nd}$ portion. As will be discussed in greater detail with reference to FIGS. 6 and 7, if FIG. 3 is constructed to implement a multi-tap differential inductor, the $2^{nd}$ winding may include shunt windings on different layers. By utilizing shunt windings, the series resistance of the inductor decreases thereby increasing the quality factor of the inductor.

FIG. 4 illustrates a cross sectional view of transformer 10 or 30 to include dielectric layer 44, dielectric layer 46, and dielectric layer 48. The dielectric layer 44 supports a $1^{st}$ metalization layer that is used to fabricate the $2^{nd}$ winding 14. The dielectric layer 46 supports the bridges 42 and the coupling to the reference potential 40. The dielectric layer 48 supports the $1^{st}$ winding 12.

FIG. 5 illustrates a bottom view of transformer 10 or 30 and illustrates the geometric shape of an embodiment of the $1^{st}$ winding 12. The $1^{st}$ winding 12 is shown to include one turn but may include multiple turns depending on the desired turns ratio for transformer 10 or 30.

Figure 6:
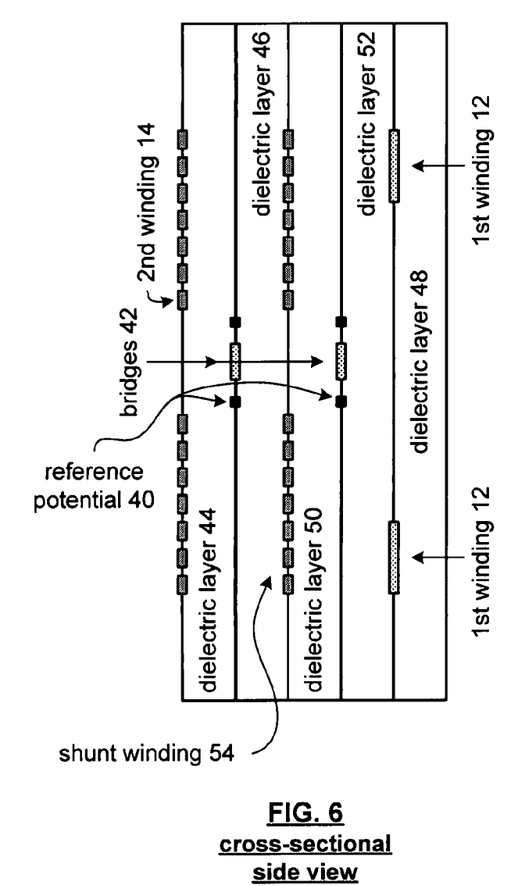
FIG. 6 is a cross sectional view of a multi-layered multiple tap transformer balun in accordance with the present invention.

FIG. 6 illustrates an alternate cross sectional view of transformer 10 and 30 where the $2^{nd}$ winding includes a shunt winding 54. In this embodiment, two additional dielectric layers 50 and 52 are illustrated. As shown, the shunt winding 54 is supported by dielectric layer 50 and the corresponding bridges and coupling to reference potential 40 are supported by dielectric layer 52. The shunt winding 54 is coupled in parallel with the $2^{nd}$ winding 14 to reduce the resistivity of the $2^{nd}$ winding 14. The $1^{st}$ winding 12 is supported by dielectric layer 48.

Figure 7:
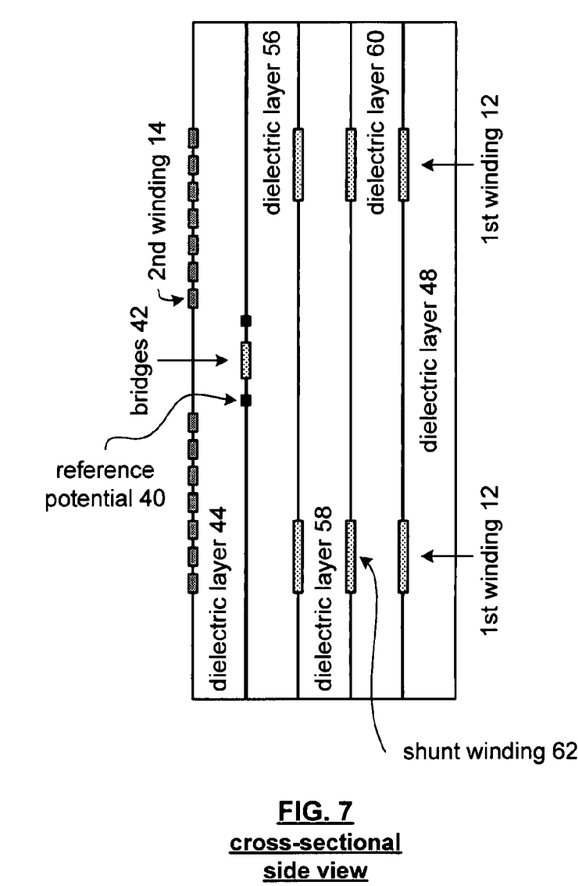
FIG. 7 is a cross sectional diagram of an alternate on-chip multi-tap transformer balun in accordance with the present invention.

FIG. 7 illustrates an alternate cross sectional view of transformer 10 or 30 that includes the primary winding including one or more shunt windings 62. In this example, the primary winding includes two shunt windings 62. As shown, the additional shunt windings are supported by dielectric layers 58 and 60.

As one of average skill in the art will appreciate, the $2^{nd}$ winding 14 as well as the $1^{st}$ winding 12 may include shunt windings. As such, a transformer incorporating a combination of FIGS. 6 and 7 may be readily obtained.

Figure 8:
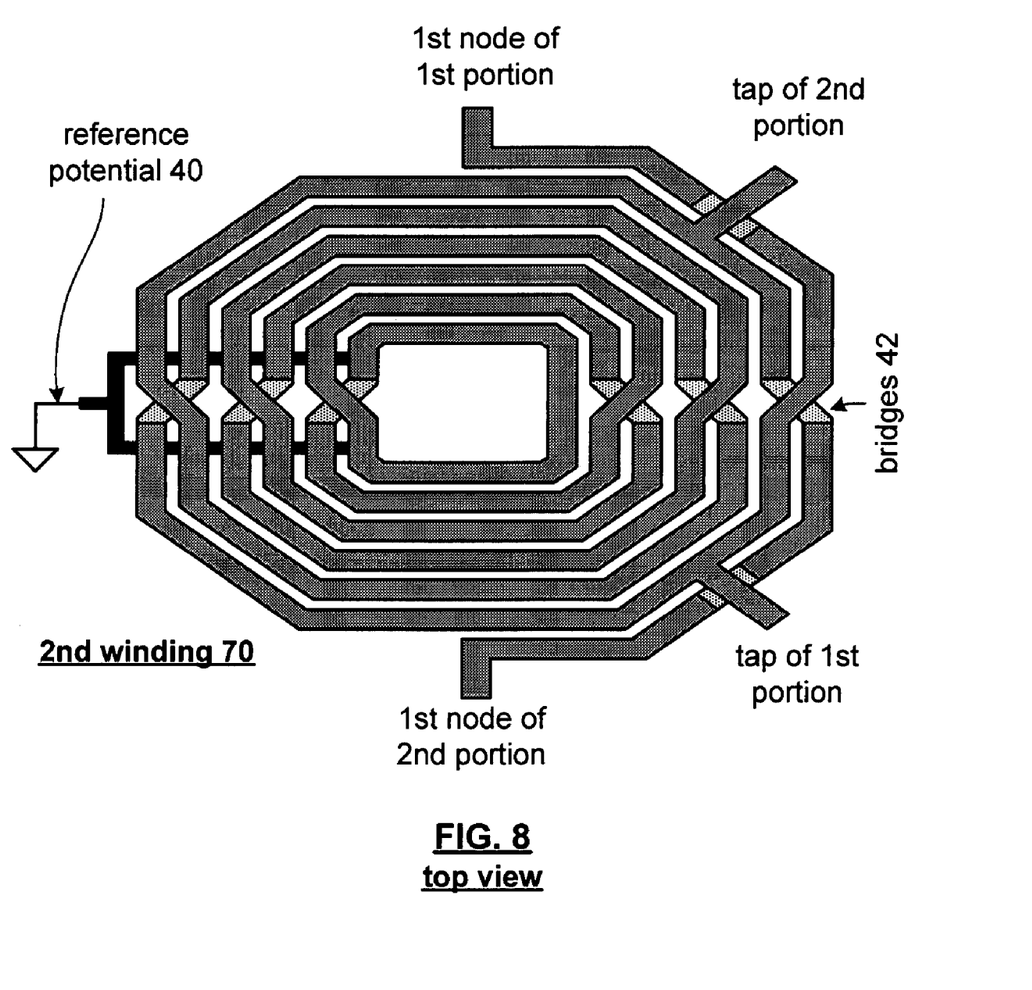
FIG. 8 is a graphical representation of an alternate $2^{nd}$ winding for an on-chip multi-tap transformer balun or a on-chip multi-tap inductor in accordance with the present invention.

FIG. 8 illustrates an alternate geometric shape for the $2^{nd}$ winding 70 or for the multi-tap differential inductor. In this configuration, the geometric shape corresponds to a rectangular octagonal shape. The particular length and width of the rectangular octagonal shape is based on a balancing of the inductance value, the turns ratio, the quality factor and capacitance of the windings.

As shown, the $2^{nd}$ winding 70 includes the $1^{st}$ node of the $2^{nd}$ portion, a tap of the $1^{st}$ portion, bridges 42, a tap of the $2^{nd}$ portion, a $1^{st}$ node of the $1^{st}$ portion, and coupling to a reference potential 40.

Figure 9:
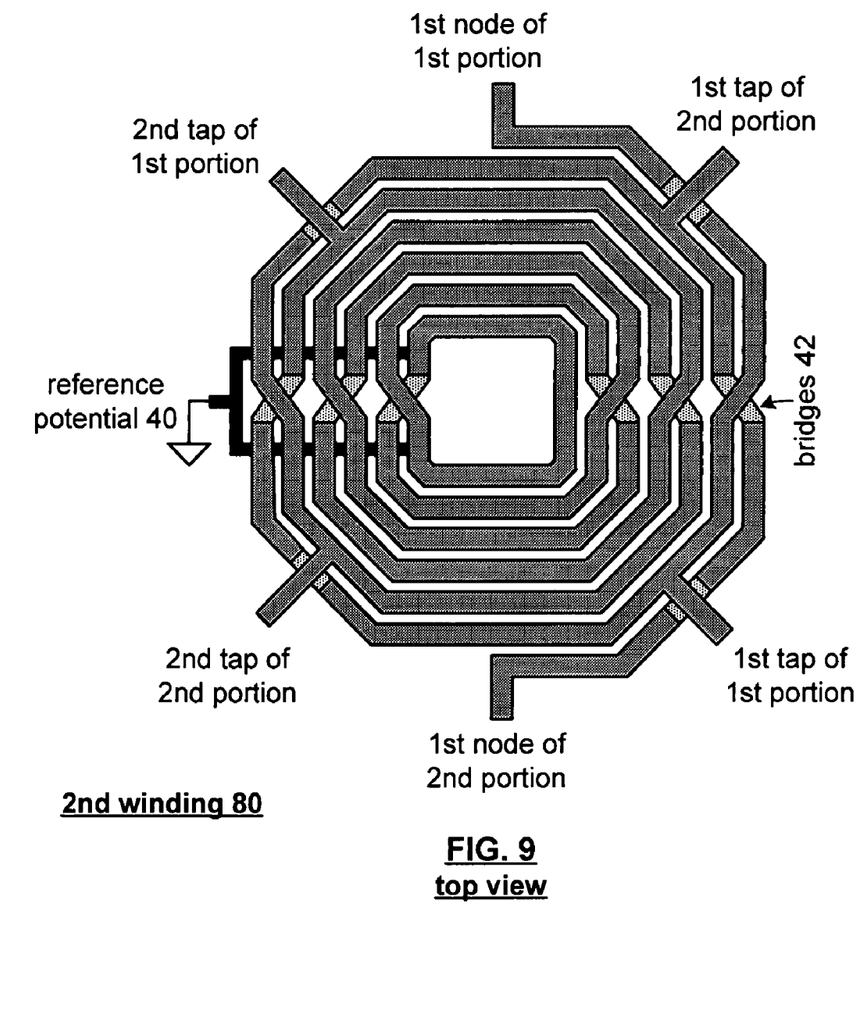
FIG. 9 is a diagram of an alternate $2^{nd}$ winding for an on-chip multi-tap transformer balun or inductor in accordance with the present invention.

FIG. 9 illustrates an alternate embodiment of the $2^{nd}$ winding 80 or the multi-tap differential inductor. In this embodiment, the $1^{st}$ and $2^{nd}$ portions each include a $1^{st}$ and $2^{nd}$ tap. The $2^{nd}$ taps of the $1^{st}$ and $2^{nd}$ portion are operably coupled to receive a $3^{rd}$ differential signal.

As shown, the $1^{st}$ portion includes a $1^{st}$ tap and a $2^{nd}$ tap and two nodes. The $2^{nd}$ portion includes a $1^{st}$ node and $2^{nd}$ node and two taps. The bridges are used to couple the various windings together and to maintain symmetry of the $2^{nd}$ winding 80.

Figure 10:
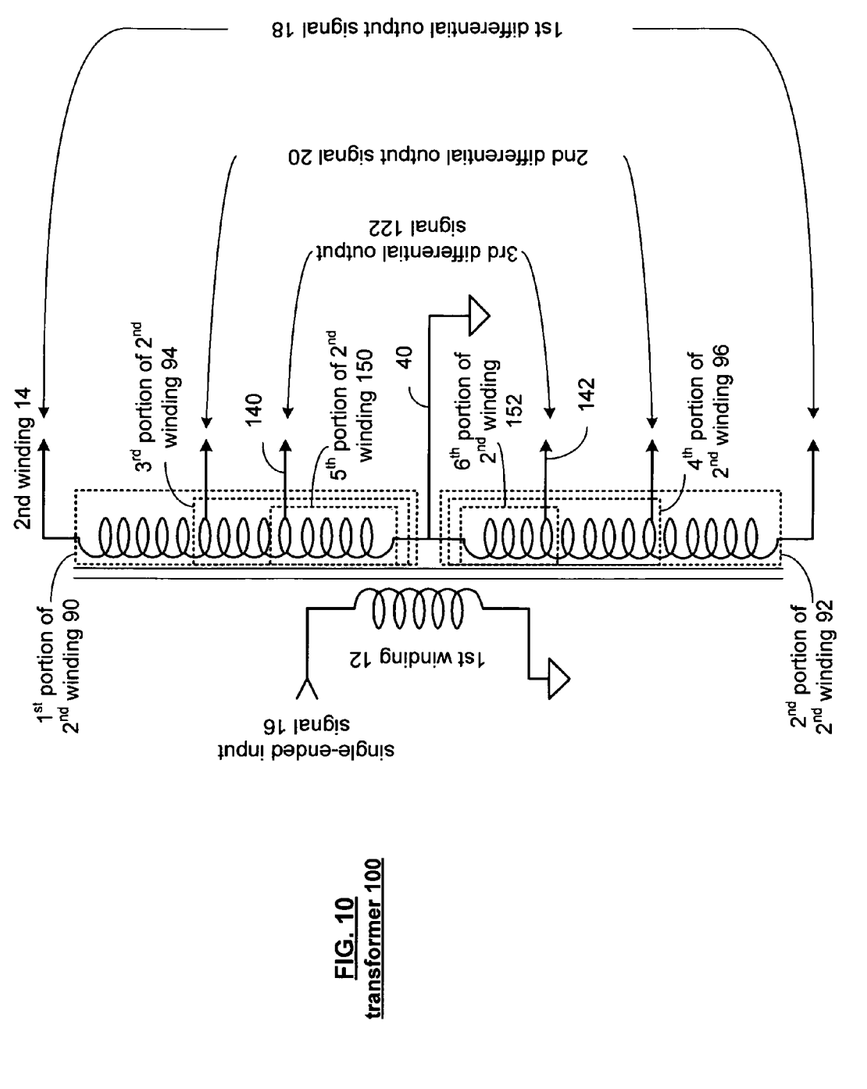
FIG. 10 is a schematic diagram of the alternate $2^{nd}$ winding for an on-chip multi-tap transformer balun or inductor of FIG. 9, in accordance with the present invention.

FIG. 10 is a schematic diagram of the on-chip multi-tap transformer balun or inductor of FIG. 9, in accordance with the present invention. This schematic contains many common elements of FIG. 1 that are referred to by common reference numerals. In addition, $3^{rd}$ differential output signal 122 is generated across a $5^{th}$ portion 150 of the $2^{nd}$ winding 14 between the reference potential 40 and the $2^{nd}$ tap 140 of the $1^{st}$ portion 90 and a $6^{th}$ portion 152 of the $2^{nd}$ winding 14 between the reference potential 40 and the $2^{nd}$ tap 142 of the $2^{nd}$ portion 92.

The preceding discussion has presented an on-chip multiple tap transformer balun and/or multiple tap differential inductor. As one of average skill in the art will appreciate, other embodiments may be derived from the teaching of the present invention, without deviating from the scope of the claims.

What is claimed is:

1. An on-chip multiple tap transformer balun comprises:
   first winding operably coupled for a single-ended signal; and
   a second windings operably coupled for at least one of a first differential signal and a second differential signal, wherein a first portion of the second winding is symmetrical with a second portion of the second winding, and a third portion of the second winding is symmetrical with a fourth portion of the second winding, and when the first differential signal is coupled to the second winding, the first differential signal is coupled across the first portion and the second portion of the second winding, and when the second differential signal is coupled to the second winding, the second differential signal is coupled across the third portion and the fourth portion of the second winding;
   wherein the second winding is electrically isolated from the first winding and electromagnetically coupled to the first winding.

2. The on-chip multiple tap transformer balun of claim 1, wherein the second winding comprises a substantially octagon interwound shape with a plurality of taps for coupling to the first and second differential signals.

3. The on-chip multiple tap transformer balun of claim 1 wherein the first winding is on at least one layer of an integrated circuit, the on-chip multiple tap transformer balun further comprises:
   a shunt winding on a different layer of the integrated circuit from the at least one layer, wherein the shunt winding is coupled in parallel with the first winding.

4. The on-chip multiple tap transformer balun of claim 1, wherein the second winding further comprises:
   fifth and sixths portions of the second winding operably coupled for a third differential signal, wherein the fifth portion of the second winding is symmetrical with the sixth portion of the second winding and wherein the third differential signal is coupled across the fifth portion and the sixth portion of the second winding.

5. The on-chip multiple tap transformer balun of claim 1 wherein the second winding is on at least one layer of an integrated circuit, the on-chip multiple tap transformer balun further comprises:
   a shunt winding on a different layer of the integrated circuit from the at least one layer, wherein the shunt winding is connected in parallel to with the second winding.

6. The on-chip multiple tap transformer balun of claim 1 comprises:
   the first winding being on a first layer of an integrated circuit;
   the second winding being on a second layer of the integrated circuit, wherein the second layer is a metalization layer of the integrated circuit having lowest resistivity.

7. The on-chip multiple tap transformer balun of claim 1, wherein the first winding further comprises multiple turns.

8. The on-chip multiple tap transformer balun of claim 1, wherein the second winding further comprises:
   a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

9. The on-chip multiple tap transformer balun of claim 1 further comprises:
   an integrated circuit size based on a balancing of inductance values of the on-chip multiple tap transformer balun, turns ratio of the on-chip multiple tap transformer balun, quality factor of the on-chip multiple tap transformer balun, and capacitance of the on-chip multiple tap transformer balun.

10. An on-chip multiple tap transformer balun comprises:
    first winding on at least one layer of an integrated circuit, operably coupled for a single-ended signal;

a second winding operably coupled for at least one of a first differential signal and a second differential signal, wherein a first portion of the second winding is symmetrical with a second portion of the second winding, and a third portion of the second winding is symmetrical with a fourth portion of the second winding, and when the first differential signal is coupled to the second winding, the first differential signal is coupled across the first portion and the second portion of the second winding, and when the second differential signal is coupled to the second winding, the second differential signal is coupled across the third portion and the fourth portion of the second winding; and a shunt winding on a different layer of the integrated circuit from the at least one layer, wherein the shunt winding is coupled in parallel with the first winding.

11. The on-chip multiple tap transformer balun of claim 10, wherein the second winding comprises a substantially octagon interwound shape with a plurality of taps for coupling to the first and second differential signals.

12. The on-chip multiple tap transformer balun of claim 10, wherein the second winding further comprises:

fifth and sixth portions of the second winding operably coupled for a third differential signal, wherein the fifth portion of the second winding is symmetrical with the sixth portion of the second winding and wherein the third differential signal is coupled across the fifth portion and the sixth portion of the second winding.

13. The on-chip multiple tap transformer balun of claim 10 comprises:

the first winding being on a first layer of an integrated circuit;

the second winding being on a second layer of the integrated circuit, wherein the second layer is a metalization layer of the integrated circuit having lowest resistivity.

14. The on-chip multiple tap transformer balun of claim 1, wherein the second winding further comprises:

a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

15. An on-chip multiple tap transformer balun comprises:

first winding operably coupled for a single-ended signal;

a second winding on at least one layer of an integrated circuit, operably coupled for at least one of a first differential signal and a second differential signal, wherein a first portion of the second winding is symmetrical with a second portion of the second winding, and a third portion of the second winding is symmetrical with a fourth portion of the second winding, and when the first differential signal is coupled to the second winding, the first differential signal is coupled across the first portion and the second portion of the second winding, and when the second differential signal is coupled to the second winding, the second differential signal is coupled across the third portion and the fourth portion of the second winding; and a shunt winding on a different layer of the integrated circuit from the at least one layer, wherein the shunt winding is coupled in parallel with the second winding.

16. The on-chip multiple tap transformer balun of claim 15, wherein the second winding comprises a substantially octagon interwound shape with a plurality of taps for coupling to the first and second differential signals.

17. The on-chip multiple tap transformer balun of claim 15, wherein the second winding further comprises:

fifth and sixth portions of the second winding operably coupled for a third differential signal, wherein the fifth portion of the second winding is symmetrical with the sixth portion of the second winding and wherein the third differential signal is coupled across the fifth portion and the sixth portion of the second winding.

18. The on-chip multiple tap transformer balun of claim 15 comprises:

the first winding being on a first layer of an integrated circuit;

the second winding being on a second layer of the integrated circuit, wherein the second layer is a metalization layer of the integrated circuit having lowest resistivity.

19. The on-chip multiple tap transformer balun of claim 15, wherein the second winding further comprises:

a rectangular octagonal shape having a first dimension lengthened with respect to a square octagonal reference shape and having a second dimension shortened with respect to the square octagonal reference shape, wherein area of the rectangular octagonal shape is similar to area of the square octagonal reference shape.

* * * * *